United States Patent
Smith et al.

(10) Patent No.: US 7,344,951 B2
(45) Date of Patent: Mar. 18, 2008

(54) SURFACE PREPARATION METHOD FOR SELECTIVE AND NON-SELECTIVE EPITAXIAL GROWTH

(75) Inventors: Patricia B. Smith, Colleyville, TX (US); Majid M. Mansoori, Plano, TX (US); Shirin Siddiqui, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 244 days.

(21) Appl. No.: 10/939,862

(22) Filed: Sep. 13, 2004

(65) Prior Publication Data

US 2006/0057810 A1 Mar. 16, 2006

(51) Int. Cl.
*H01L 21/336* (2006.01)
(52) U.S. Cl. .............. 438/300; 438/270; 438/278; 438/301; 438/305; 257/E21.431
(58) Field of Classification Search ............ 438/300, 438/270, 278, 301
See application file for complete search history.

(56) References Cited

U.S. PATENT DOCUMENTS

| 4,895,810 | A | * | 1/1990 | Meyer et al. | 438/274 |
| 5,508,539 | A | * | 4/1996 | Gilbert et al. | 257/280 |
| 5,705,417 | A | * | 1/1998 | Tseng | 438/305 |
| 6,541,343 | B1 | * | 4/2003 | Murthy et al. | 438/299 |
| 6,812,103 | B2 | * | 11/2004 | Wang et al. | 438/300 |
| 2005/0095795 | A1 | * | 5/2005 | Son et al. | 438/300 |

* cited by examiner

*Primary Examiner*—Michael Lebentritt
*Assistant Examiner*—Kyoung Lee
(74) *Attorney, Agent, or Firm*—W. James Brady, III; Frederick J. Telecky, Jr.

(57) ABSTRACT

According to one embodiment of the invention, a surface preparation method for selective and non-selective epitaxial growth includes providing a substrate having a gate region, a source region, and a drain region, etching a first portion of the source region and the drain region, and removing a second portion of the source region and the drain region by a plasma comprising a noble gas and oxygen.

27 Claims, 2 Drawing Sheets

SURFACE PREPARATION METHOD FOR SELECTIVE AND NON-SELECTIVE EPITAXIAL GROWTH

TECHNICAL FIELD OF THE INVENTION

The present invention relates generally to the field of semiconductor devices and, more particularly, to a surface preparation method for selective and non-selective epitaxial growth.

BACKGROUND OF THE INVENTION

Traditional surface preparation for low temperature (500° C.-700° C.) selective or non-selective epitaxial growth includes an ex-situ hydrofluoric ("HF") acid deglaze, followed by an in-situ high temperature bake (900° C. for two minutes) under a reducing ambient, such as hydrogen. The combination of these two techniques ensures surface cleanliness and surface hydrogen termination. Any residual oxide or hydrocarbon contamination may interfere with the epitaxial alignment of the deposited film with the underlying substrate. Residual oxide or hydrocarbons may result from other processing steps that may precede the epitaxial process. In addition to poor epitaxial quality, residual contamination may lead to the formation of stacking faults and other embedded defects. These defects can severely impact the materials and electrical properties of the epitaxial film being deposited. In addition, the Si surface becomes damaged during the plasma etch of Si, which occurs prior to the epitaxial growth step. Disruption of the near-surface Si lattice can also negatively impact the epitaxial growth of high quality Si.

SUMMARY OF THE INVENTION

According to one embodiment of the invention, a surface preparation method for selective and non-selective epitaxial growth includes providing a substrate having a gate region, a source region, and a drain region, etching a first portion of the source region and the drain region, and removing a second portion of the source region and the drain region by a plasma comprising a noble gas and oxygen.

Embodiments of the invention provide a number of technical advantages. Embodiments of the invention may include all, some, or none of these advantages. According to one embodiment, an ideal surface for epitaxial growth is provided. In one embodiment, such a surface is achieved by a plasma clean that removes organic contamination and about 50 Å of damaged silicon. This facilitates a significant reduction in the pre-epitaxial deposition thermal budget. The surface preparation process is quick (10-15 seconds per wafer) and the timing from plasma surface preparation to epi growth is not tightly controlled, which indicates manufacturing capability and robustness. In addition, no special tools, or alterations to those tools are required. Tools used for plasma etching or plasma photoresist removal processing, for example, may be used.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1 through 4 of the drawings, in which like numerals refer to like parts.

Figure 1:
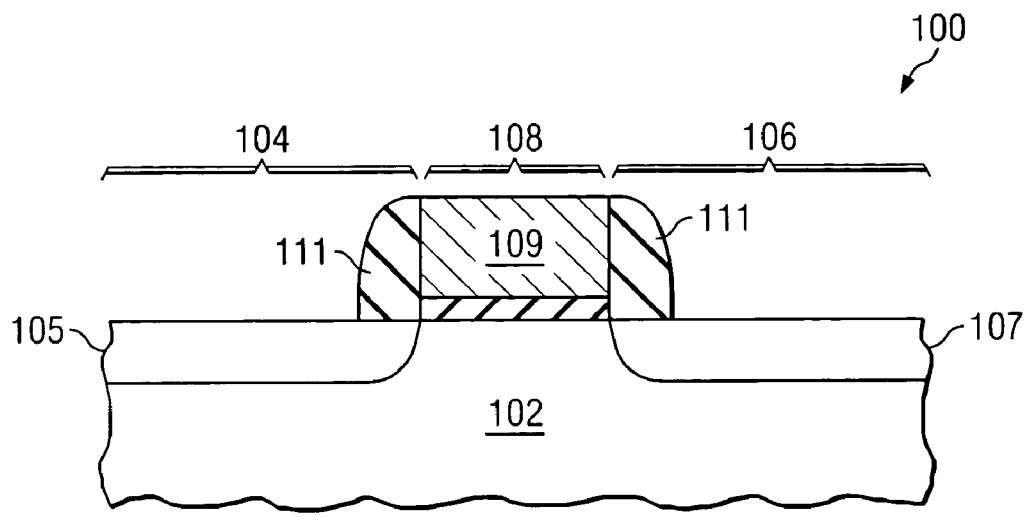
FIG. 1 is a cross-sectional view illustrating a portion of a MOSFET in accordance with one embodiment of the present invention.

FIG. 1 is a cross-sectional view illustrating a portion of a metal-oxide semiconductor field effect transistor ("MOSFET") 100 in accordance with one embodiment of the present invention. MOSFET 100, as used throughout this detailed description, represents a partially completed MOSFET, such as an NMOS, PMOS, CMOS, or other suitable semiconductor device. In the illustrated embodiment, MOSFET 100 includes a substrate 102, a source region 104 having a source 105, a drain region 106 having a drain 107, and a gate region 108 having a gate 109.

Substrate 102 may be formed from any suitable semiconductor material, such as silicon. For example, substrate 102 may be a silicon wafer, a silicon wafer with previously fabricated embedded devices, an epitaxial layer grown on a wafer, a semiconductor on insulation ("SOI") system, strained silicon substrate, or other suitable substrates having any suitable crystal orientation.

Both source 105 and drain 107 may be formed in source region 104 and drain region 106, respectively, using any suitable techniques used in semiconductor processing, such as ion implantation. For example, if MOSFET 100 is a P-type transistor, then boron or other suitable P-type dopant may be implanted during the ion implantation process to form source 105 and drain 107. If MOSFET 100 is an N-type transistor, then arsenic, phosphorous, antimony, or other suitable N-type dopant may be implanted in substrate 102 to form source 105 and drain 107. Although source 105 and drain 107 are illustrated in FIG. 1 as being recessed, the present invention contemplates other low temperature epitaxy (both selective and non-selective) and even high temperature (blanket epitaxy) processing.

Gate 109 may be formed using any suitable growth and/or deposition techniques used in semiconductor processing and may be formed from any suitable material, such as polysilicon. A pair of sidewalls 111 may also be formed using any suitable growth and/or deposition techniques used in semiconductor processing and may be formed from any suitable dielectric material, such as oxide, nitride, or other suitable materials.

Figure 2:
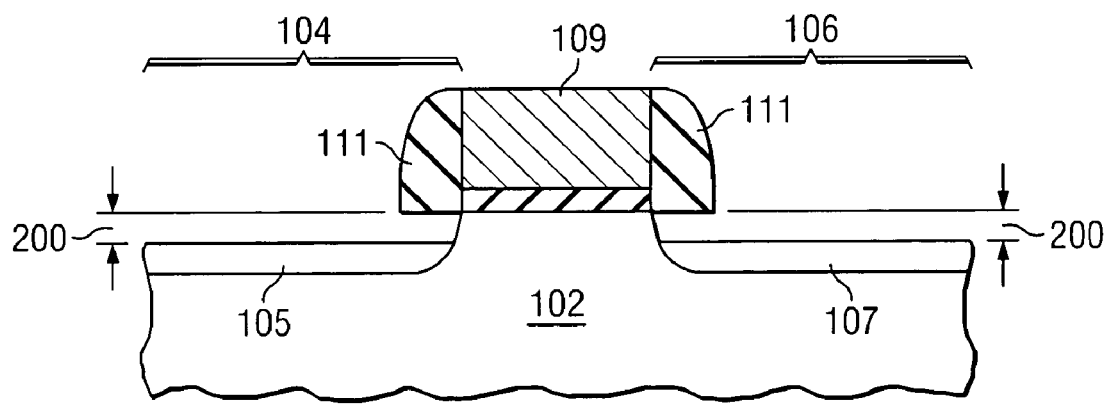
FIG. 2 is a cross-sectional view of the MOSFET of FIG. 1 illustrating the etching of the source and drain regions of the MOSFET in accordance with one embodiment of the present invention.

FIG. 2 is a cross-sectional view of MOSFET 100 illustrating the etching of source region 104 and drain region 106 in accordance with one embodiment of the present invention. More specifically, a first portion 200 of source region 104 and drain region 106 is etched via any suitable etching process. Although any suitable amount of material may be etched away during the etching process of first portion 200, in one embodiment, a depth of first portion 200 that is etched is between 300 Å and 1000 Å. The etching of source region 104 and drain region 106 may result in some contamination of substrate 102, in addition to introducing a roughness to the resulting surface and damage to the lattice. These conditions may interfere with the epitaxial alignment of a subsequently deposited epitaxial film with the underlying substrate. Contamination may also lead to the formation of stacking faults and other embedded defects, which may severely impact the materials and electrical properties of the deposited epitaxial film.

Therefore, according to the teachings of one embodiment of the invention, a surface preparation method for selective and non-selective epitaxial growth is performed using a plasma process. One such embodiment of this method is illustrated in FIGS. 3A and 3B.

Figure 3A:
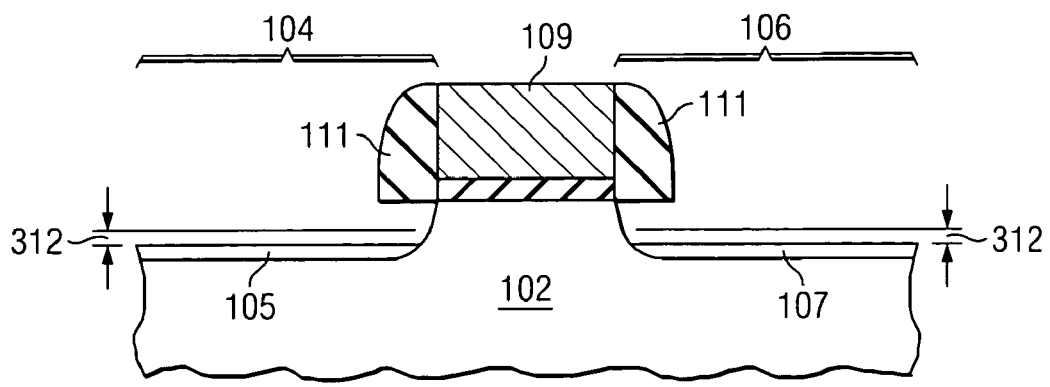
FIG. 3A is a cross-sectional view of the MOSFET of FIG. 1 illustrating the removal of a portion of the source and drain regions of the MOSFET in accordance with one embodiment of the present invention.

FIG. 3A is a cross-sectional view of MOSFET 100 illustrating the removal of a second portion 312 of source region 104 and drain region 106 in accordance with one embodiment of the present invention. Although any suitable amount of material may be removed from source region 104 and drain region 106, in one embodiment, a depth of second portion 312 is between 30 Å and 50 Å. Second portion 312 is removed by utilizing a plasma process, an example of which is schematically illustrated in FIG. 3B, to aid in preparing the surface for a subsequent epitaxial growth, as described in more detail below.

Figure 3B:
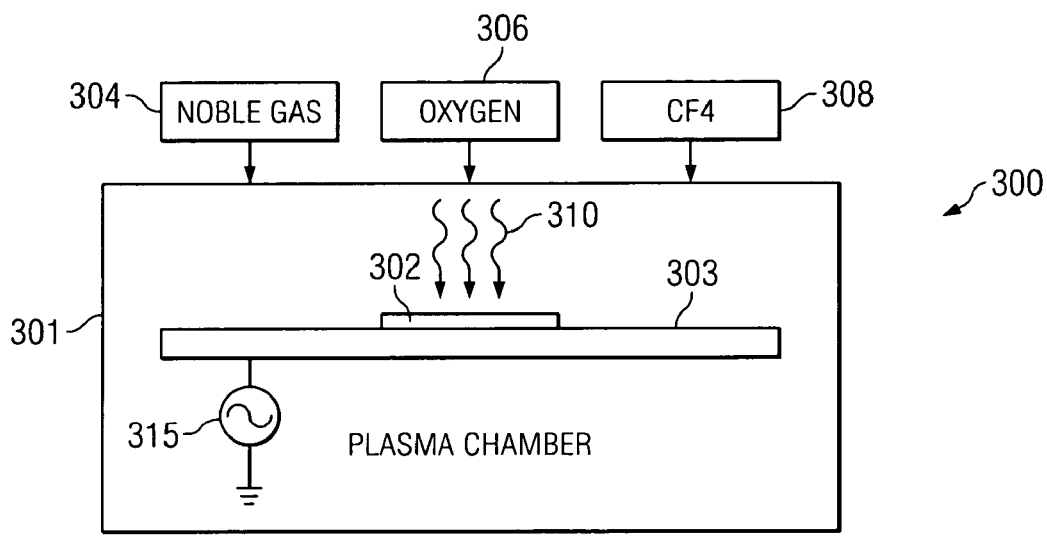
FIG. 3B is a schematic of a plasma process, in accordance with one embodiment of the present invention, used to remove the portion of the source and drain regions as illustrated in FIG. 3A.

FIG. 3B is a schematic of a plasma tool 300 used to remove second portion 312 of source region 104 and drain region 106 in accordance with one embodiment of the present invention. Examples of plasma tool 300 include the Mattson Aspen II platform and Aspen III platform photoresist removal (or strip) tools. Other appropriate tools may include bias plasma, or non-bias plasma tools, such as are typically used for plasma etch processing or for photoresist removal in the semiconductor industry. Many such tools are available, and common suppliers would be, for example, Novellus, Applied Materials, and Axcelis. In the illustrated embodiment, plasma tool 300 includes a plasma chamber 301 having a base 303 supporting a wafer 302, which includes a plurality of MOSFETs, such as MOSFET 100, formed therein. In one embodiment, a plasma 310 is formed from a noble gas from noble gas supply 304 and oxygen from an oxygen supply 306. In other embodiments, carbon tetrafluoride ($CF_4$) from a carbon tetrafluoride supply 308 is utilized. Other oxygen sources and other fluorine sources, such as $C_2F_6$ or $NF_3$ could also be used.

Although any suitable noble gas may be utilized, in one embodiment, either argon or helium is utilized as the noble gas from noble gas supply 304. Other noble gases, such as neon, krypton, and xenon may also be utilized. In a particular embodiment of the invention, the noble gas comprises between 70% and 90% by volume of plasma 310. Although any suitable amount of oxygen may be utilized for plasma 310, in one embodiment, the oxygen comprises between 15% and 25% by volume of plasma 310. In an embodiment where $CF_4$ is utilized, the amount of $CF_4$ from carbon tetrafluoride supply 308 comprises between one and two percent by volume of plasma 310.

Advantages of using a plasma process for preparing the surface resulting from the material removal as illustrated in FIG. 3A are that it is a quick process (10-15 seconds per wafer in some embodiments) and provides an excellent surface for a subsequent epitaxial growth. The plasma process removes organic contamination in addition to damaged silicon by removing second portion 312 of source region 104 and drain region 106. This further facilitates a significant reduction in the pre-epitaxial growth thermal budget. Previous surface preparation techniques for epitaxial growth included an ex-situ hydrofluoric acid deglaze, followed by an in-situ high temperature bake under a reducing ambient such as hydrogen. This high temperature bake was performed at a minimum of 900° C. for a minimum of two minutes. With the plasma process as illustrated in FIG. 3B, the hydrogen bake may be performed at a temperature of no greater than approximately 800° F. for no more than approximately one minute, in one embodiment. At some lower temperature pre-bake conditions, periods of one to five minutes might be used.

Example process conditions for an embodiment where $CF_4$ is not utilized, are as follows: a plasma chamber pressure of 5 mT, processing time of 15 seconds, a power of 600 watts, a 100-watt bias, as indicated by reference numeral 315, a temperature of 25° C., 40 sccm $O_2$ and 160 sccm Ar. Example process conditions for an embodiment where $CF_4$ is utilized are as follows: a chamber pressure of 10 mT, processing time of 15 seconds, a power of 600 watts, a 100-watt bias, 300 sccm Ar, 75 sccm $O_2$, and 7 sccm $CF_4$. The present invention, however, contemplates other suitable processing conditions for the plasma process illustrated in FIG. 3B.

Figure 4:
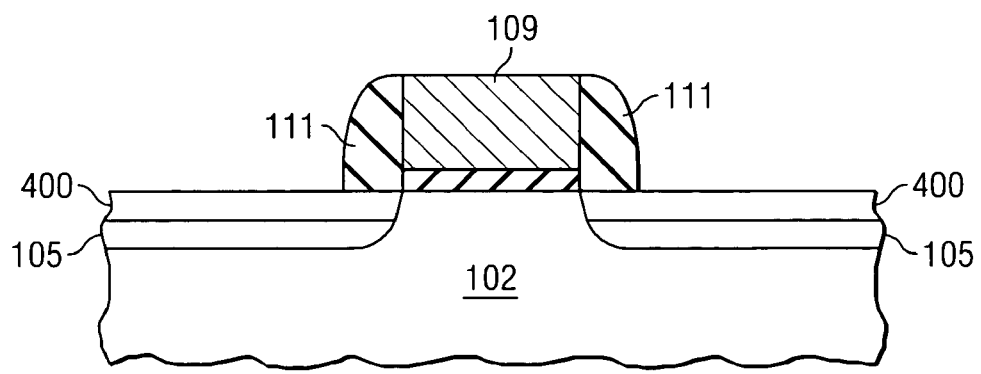
FIG. 4 is a cross-sectional view of the MOSFET of FIGS. 1 through 3A illustrating an epitaxial growth in accordance with one embodiment of the present invention.

FIG. 4 is a cross-sectional view of MOSFET 100 illustrating an epitaxial growth in accordance with one embodiment of the present invention. As illustrated in FIG. 4, an epitaxial layer 400 has been formed in source region 104 and drain region 106. Epitaxial layer may be any suitable epitaxial layer, such as an epitaxial silicon layer or an epitaxial silicon-germanium layer. Epitaxial layer 400 may have any suitable thickness depending on the size of the particular transistor being fabricated. One function of epitaxial layer 400 is to increase the compressive stress within the channel of the transistor that exists between source 105 and drain 107 beneath gate 109. This aids in hole mobility for MOSFET 100.

Although embodiments of the invention and their advantages are described in detail, a person skilled in the art could make various alterations, additions, and omissions without departing from the spirit and scope of the present invention as defined by the appended claims.

What is claimed is:

1. A surface preparation method for selective and non-selective epitaxial growth, comprising:

providing a substrate having a gate region, a source region, and a drain region;

etching a first portion of the source region and the drain region; and removing a second portion of the source region and the drain region by a plasma comprising a noble gas and oxygen;

said step of removing including a processing time of not more than about 15 seconds.

2. The method of claim 1, wherein the source and drain regions are raised.

3. The method of claim 1, wherein the source and drain regions are recessed.

4. The method of claim 1, wherein the second portion comprises a depth of between approximately 30 Å and 50 Å.

5. The method of claim 1, wherein the noble gas is selected from the group consisting of argon, helium, neon, krypton, and xenon.

6. The method of claim 1, wherein the noble gas comprises between 70% and 90% by volume of the plasma and the oxygen comprises between 15% and 25% by volume of the plasma.

7. The method of claim 1, wherein the plasma further comprises a fluorine containing gas selected from the group consisting of $CF_4$, $C_2F_6$ and $NF_3$.

8. The method of claim 7, wherein the noble gas comprises between 70% and 90% by volume of the plasma, the oxygen comprises between 15% and 25% by volume of the plasma, and the fluorine containing gas comprises between 1% and 2% by volume of the plasma.

9. A method for selective and non-selective epitaxial growth, comprising:
providing a substrate having a gate region, a source region, and a drain region;
etching a first portion of the source region and the drain region;
removing a second portion of the source region and the drain region by a plasma comprising a noble gas and oxygen;
said step of removing including a processing time of not more than about 15 seconds; and
forming an epitaxial layer outwardly from each of the source and drain regions.

10. The method of claim 9, wherein the epitaxial layer is selected from the group consisting of an epitaxial silicon layer and epitaxial silicon-germanium layer.

11. The method of claim 9, wherein the source and drain regions are selected from the group consisting of raised and recessed.

12. The method of claim 9, wherein the second portion comprises a depth of between approximately 30 Å and 50 Å.

13. The method of claim 9, wherein the noble gas is selected from the group consisting of argon, helium, neon, krypton, and xenon.

14. The method of claim 9, wherein the noble gas comprises between 70% and 90% by volume of the plasma and the oxygen comprises between 15% and 25% by volume of the plasma.

15. The method of claim 9, wherein the plasma further comprises a fluorine containing gas selected from the group consisting of $CF_4$, $C_2F_6$ and $NF_3$.

16. The method of claim 15, wherein the noble gas comprises between 70% and 90% by volume of the plasma, the oxygen comprises between 15% and 25% by volume of the plasma, and the fluorine containing gas comprises between 1% and 2% by volume of the plasma.

17. A method for selective and non-selective epitaxial growth, comprising:
providing a substrate having a gate region, a source region, and a drain region;
etching a first portion of the source region and the drain region;
removing a second portion of the source region and the drain region by a plasma comprising a noble gas and oxygen;
performing a hydrofluoric acid deglaze on the substrate; then
hydrogen baking the substrate at a temperature of no greater than approximately 800° F.; and
forming an epitaxial layer outwardly from each of the source and drain regions subsequent to said performing and baking.

18. The method of claim 17, wherein the hydrogen baking step is performed for no more than approximately one minute.

19. A method for selective and non-selective epitaxial growth, comprising:
providing a substrate having a gate region, a source region, and a drain region;
etching a first portion of the source region and the drain region;
removing a second portion of the source region and the drain region by a plasma comprising:
a noble gas selected from the group consisting of argon and helium;
oxygen;
and carbon tetrafluoride;
performing a hydrofluoric acid deglaze on the substrate;
hydrogen baking the substrate at a temperature of no greater than approximately 800° F. for no more than approximately one minute; and
forming an epitaxial layer selected from the group consisting of an epitaxial silicon layer and epitaxial silicon-germanium layer outwardly from each of the source and drain regions.

20. The method of claim 19, wherein the noble gas comprises between 70% and 90% by volume of the plasma, the oxygen comprises between 15% and 25% by volume of the plasma, and the carbon tetrafluoride comprises between 1% and 2% by volume of the plasma.

21. The method of claim 17, wherein the epitaxial layer is selected from the group consisting of an epitaxial silicon layer and epitaxial silicon-germanium layer.

22. The method of claim 17, wherein the source and drain regions are selected from the group consisting of raised and recessed.

23. The method of claim 17, wherein the second portion comprises a depth of between approximately 30 Å and 50 Å.

24. The method of claim 17, wherein the noble gas is selected from the group consisting of argon, helium, neon, krypton, and xenon.

25. The method of claim 17, wherein the noble gas comprises between 70% and 90% by volume of the plasma and the oxygen comprises between 15% and 25% by volume of the plasma.

26. The method of claim 17, wherein the plasma further comprises a fluorine containing gas selected from the group consisting of $CF_4$, $C_2F_6$ and $NF_3$.

27. The method of claim 26, wherein the noble gas comprises between 70% and 90% by volume of the plasma, the oxygen comprises between 15% and 25% by volume of the plasma, and the fluorine containing gas comprises between 1% and 2% by volume of the plasma.

* * * * *